United States Patent
Stelzl et al.

[11] Patent Number: 6,136,175
[45] Date of Patent: Oct. 24, 2000

[54] METHOD OF PRODUCING AN ELECTRONIC COMPONENT, IN PARTICULAR A SURFACE ACOUSTIC WAVE COMPONENT

[75] Inventors: Alois Stelzl; Hans Krüger; Wolfgang Pahl; Jürgen Machui, all of München, Germany

[73] Assignee: Siemens Aktiengesellschaft, Munich, Germany

[21] Appl. No.: 09/103,160

[22] Filed: Jun. 22, 1998

Related U.S. Application Data

[63] Continuation of application No. PCT/DE96/02410, Dec. 16, 1996.

[51] Int. Cl.[7] .............................. C25D 5/48; C23C 14/14; B05D 5/12; H04R 17/00
[52] U.S. Cl. ...................... 205/220; 205/221; 205/229; 427/531; 427/100; 29/25.35
[58] Field of Search .................... 205/199, 220, 205/221, 229, 918; 427/531, 100; 29/25.35

[56] References Cited

U.S. PATENT DOCUMENTS 4,617,487  10/1986  Sone et al. .......................... 310/313
5,815,900  10/1998  Ichikawa et al. ...................... 29/25.35

FOREIGN PATENT DOCUMENTS

4328794 A1  3/1995  Germany.
61-102810   5/1986  Japan.
2067009     7/1981  United Kingdom.

OTHER PUBLICATIONS

International Publication WO 95/30276 (Fürbacher, B. et al.), dated Nov. 9, 1995.

*Primary Examiner*—Kathryn Gorgos
*Assistant Examiner*—Edna Wong
*Attorney, Agent, or Firm*—Herbert L. Lerner; Laurence A. Greenberg; Werner H. Stemer

[57] ABSTRACT

The electronic component, specifically a SAW component with conductive structures disposed on a substrate is encapsulated for protection against environmental influences. The electrically conductive structures are sealed with a gas diffusion-constricting protective layer formed with an electrochemical or ion bombardment process.

9 Claims, 1 Drawing Sheet

METHOD OF PRODUCING AN ELECTRONIC COMPONENT, IN PARTICULAR A SURFACE ACOUSTIC WAVE COMPONENT

CROSS-REFERENCE TO RELATED APPLICATION

This is a continuation of copending international application PCT/DE96/02410, filed Dec. 16, 1996, which designated the United States.

BACKGROUND OF THE INVENTION

FIELD OF THE INVENTION

The present invention relates to a method for producing an electronic component, in particular a SAW component operating with surface acoustic waves. The component has electrically conductive structures, disposed on a surface of a substrate, and an encapsulation applied on the substrate and sealing the conductive structures. At least the conductive structures are covered with a protective layer.

An earlier, commonly owned application Ser. No. 08/743,540, filed Nov. 4, 1996, now U.S. Pat. No. 5,831,369 (see international published application WO 95/30276) describes an encapsulation for electronic components—particularly SAW components—with a cap that seals component structures on a substrate. The cap is formed by a cover which is provided on the substrate and has cutouts accommodating the component structures in regions thereof. The primary purpose of the cap cover is to protect the component structures, which in the case of SAW components, are essentially composed of electrically conductive structures on a piezoelectric substrate, against environmental influences as far as possible. This applies in particular to the encapsulation materials disclosed in the above application. It has been found that protection is not provided against gas diffusions, that is to say primarily against water vapor diffusion, or against attacks by specific chemical substances. In the context of some materials, the encapsulation behaves virtually as if it were not there with respect to water vapor diffusion. In consequence, the frequency stability of the components can no longer be guaranteed both as a result of water vapor diffusion and as a result of chemical substances.

U.S. Pat. No. 4,617,487 to Sone et al. discloses an SAW component having a cap which is, for example, nickel-coated for the purpose of sealing and corrosion resistance, and which is seated in a hermetically sealed manner on a mounting plate for the SAW component. In that case, the entire active component structure is covered by a closed tantalum pentoxide or silicon nitride layer for protection against possible short circuits caused by elements fragmenting off, for example the nickel coating.

SUMMARY OF THE INVENTION

It is accordingly an object of the invention to provide a method of producing an electronic component, specifically a SAW element, encapsulated as described above, which overcomes the above-mentioned disadvantages of the heretofore-known devices and methods of this general type and which contributes to the effective protection of the components against environmental influences in the form of gas diffusions, in particular water vapor diffusion, as well as other chemical substances.

With the foregoing and other objects in view there is provided, in accordance with the invention, a method of producing an electronic component, in particular an SAW component, the method which comprises:

providing electrically conductive structures on a surface of a substrate;

forming a gas diffusion-constricting protective layer on the conductive structures by a process selected from the group consisting of electrochemical coating and ion bombardment; and encapsulating the conductive structures and the protective layer with an encapsulation applied on the substrate and sealing the conductive structures.

In accordance with an added feature of the invention, the conductive structures have contact pads for electrically connecting the electronic component, and the method further comprises forming an additional protective layer on the substrate and on the protective layer and covering, with the additional protective layer, the conductive structures except for the contact pads.

In accordance with an additional feature of the invention, a further protective layer is formed on the encapsulation for protection against environmental influences.

In accordance with another feature of the invention, the protective layer is formed from an inorganic material selected from the group consisting of oxides, nitrides, carbides, and oxynitrides.

In accordance with a further feature of the invention, the protective layers are formed by applying an organic polymer on the protective layer covering the conductive structures and/or on the encapsulation.

In accordance with again an added feature of the invention, the electrically conductive structures are formed of a material selected from the group consisting of Al, Al+Si, and Al+Ta.

In accordance with again another feature of the invention, electrochemically produced oxides are stabilized by plasma treatment or UV irradiation.

In accordance with again an additional feature of the invention, reactive groups in the protective layer are saturated with metal-organic compounds, for instance with silanes.

In accordance with a concomitant feature of the invention, a thickness of the protective layers is finely adjusted either by adding material to the protective layer or by partially removing material from the protective layer.

Other features which are considered as characteristic for the invention are set forth in the appended claims.

Although the invention is illustrated and described herein as embodied in a method for producing an electronic component, in particular a component operating with surface acoustic waves—SAW component —, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
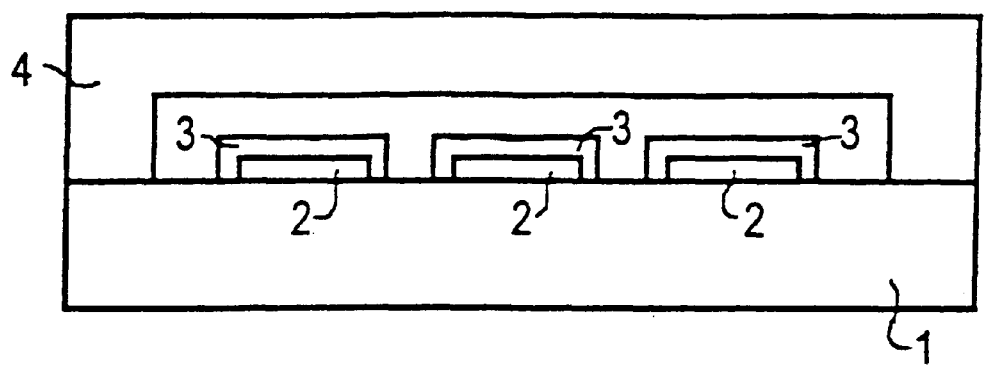
FIG. 1 is a schematic elevational view of an SAW component provided with protection against gas diffusions, the protection being produced with the method according to the invention.

DESCRIPTION OF THE PREFERRED EMBODIMENTS:

Referring now to the figures of the drawing in detail and first, particularly, to FIG. 1 thereof, there is seen a surface acoustic wave (SAW) component produced in parts using the method according to the invention. The SAW component is in principle formed by a piezoelectric substrate 1 on which electrically conductive structures 2 are provided. Typical such structures are electrode fingers of interdigital transducers, a resonator and a reflector. The structures may in this case include Al, Al+Si or Al+Ta. As has already been disclosed in the above commonly owned prior patent application, the electrically conductive structures 2 on the substrate 1 are sealed by encapsulation 4. In order to protect these structures 2 against gas diffusions, in particular against water vapor diffusion and chemical substances, they are covered by a protective layer 3 which constricts gas diffusion and, according to the invention, is produced on the conductive structure 2 electrochemically (anodic oxidation) or by ion bombardment.

In a development of the invention, the protective layer 3 may in this case be, for example, a layer which is produced from an inorganic material from the group of oxides, nitrides, carbides or oxynitrides.

Electrochemically produced oxides may be stabilized by plasma treatment and/or UV irradiation.

The protective layer 3 may be an oxide of the metal of the conductive structures 2. The latter are usually aluminum and, accordingly, the protective layer 3 may be aluminum oxide $Al_2O_3$. If the layer is produced by ion-bombardment and the layer consists of $Al_2O_3$ or AlN, then the bombardment is with $O^{--}$ $N^{--}$ ions.

Figure 2:
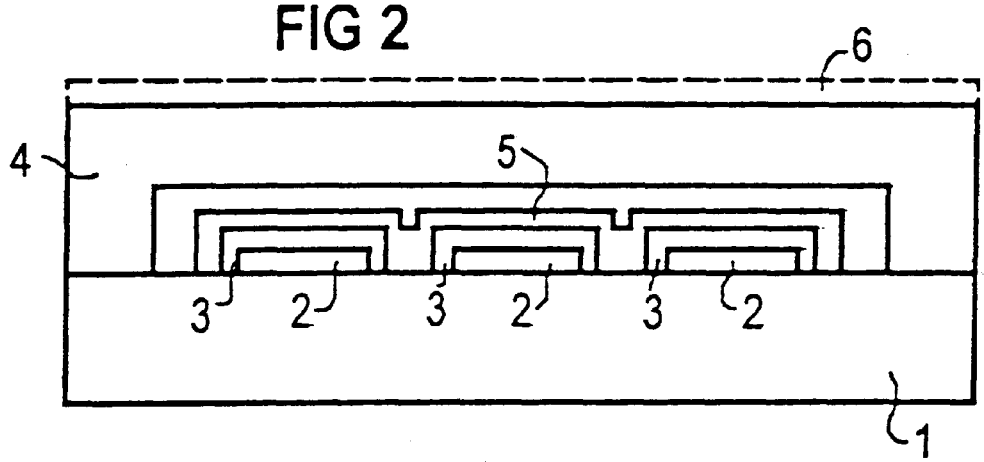
FIG. 2 is a similar view of further measure according to the invention for protection against gas diffusions.
Figure 3:
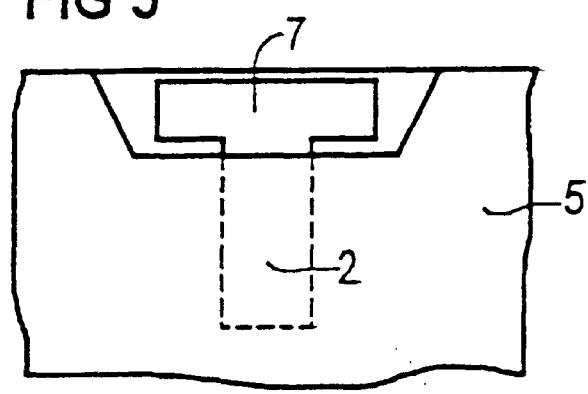
FIG. 3 is a partial plan view and schematic illustration of a detail of the SAW component according to FIG. 2 that has been treated in accordance with the invention.

With reference to FIG. 2, it is possible, in accordance with a further refinement of the invention, to apply in addition a further protective layer 5 which in turn covers the protective layers 3 and the substrate 1. The materials already described above are suitable, among others, for the protective layer 5. The protective layer 5 covers the substrate 1 and the conductive structures 2, which are covered by the protective layers 3, with the exception of connecting surfaces 7, the so-called pads 7. The protective layer 3 is not shown in FIG. 3 for reasons of clarity.

In addition to the already described protective layers 3 and 5, a protective layer 6 can be applied to the encapsulation 4. The protective layer 6, which is illustrated by dashed lines in FIG. 2, limits gas diffusions even further.

The above-mentioned materials are also suitable for the protective layer 6. Organic polymers are likewise suitable materials for the protective layers 5 and 6.

The protective layers 3, 5 and, possibly, 6 may be rendered absorption-constricting. In that case they may be saturated with metal-organic compounds, for example silanes.

Finally, the layer thickness of the protective layers 3 and 5, and thus the filter characteristics, can be accurately adjusted by further layer formation or layer removal.

We claim:

1. A method of producing an electronic component, which comprises:

providing electrically conductive surface acoustic wave structures on a surface of a substrate;

forming a gas diffusion-constricting protective layer formed of an oxide on the conductive surface acoustic wave structures by a process selected from the group consisting of electrochemical coating and ion bombardment;

encapsulating the conductive surface acoustic wave structures and the protective layer with an encapsulation applied on the substrate and sealing the conductive structures; and saturating reactive groups in the protective layer with metal-organic compounds.

2. The method according to claim 1, which comprises selecting silanes as the metal-organic compounds.

3. A method of producing an electronic component, which comprises:

providing electrically conductive surface acoustic wave structures on a surface of a substrate;

forming a gas diffusion-constricting protective layer formed of an oxide of the conductive surface acoustic wave structures material on the conductive surface acoustic wave structures by a process selected from the group consisting of electrochemical coating and ion bombardment, saturating reactive groups in the protective layer with metal-organic compounds; and encapsulating the conductive surface acoustic wave structures and the protective layer with an encapsulation applied on the substrate and sealing the conductive structures, the conductive structures have contact pads for electrically connecting the electronic component, and the method further comprises forming an additional protective layer on the substrate and on the protective layer and covering, with the additional protective layer, the conductive structures except for the contact pads.

4. A method of producing an electronic component, which comprises:

providing electrically conductive structures on a surface of a substrate wherein the conductive structures have contact pads for electrically connecting the electronic component;

forming a gas diffusion-constricting protective layer on the conductive structures by a process selected from the group consisting of electrochemical coating and ion bombardment;

encapsulating the conductive structures and the protective layer with an encapsulation applied on the substrate and sealing the conductive structures; and applying an organic polymer on the protective layer forming an additional protective layer on the substrate and on the protective layer and covering the conductive structures except for the contact pads.

5. The method according to claim 4, wherein the providing step comprises forming surface acoustic wave structures on the substrate.

6. A method of producing an electronic component, which comprises:

providing electrically conductive structures on a surface of a substrate;

forming a gas diffusion-constricting protective layer on the conductive structures by a process selected from the group consisting of electrochemical coating and ion bombardment;

saturating reactive groups in the protective layer with metal-organic compounds; and encapsulating the conductive structures and the protective layer with an encapsulation applied on the substrate and sealing the conductive structures.

7. The method according to claim 6, which comprises selecting silanes as the metal-organic compounds.

8. The method according to claim 6, which further comprises saturating reactive groups in the protective layer and in an additional protective layer with metal-organic compounds.

9. The method according to claim 6, wherein the providing step comprises forming the electrically conductive structures with a material selected from the group consisting of Al, Al+Si, and Al+Ta.

* * * * *